(12) United States Patent
Ching et al.

(10) Patent No.: US 7,872,898 B2
(45) Date of Patent: Jan. 18, 2011

(54) ONE TIME PROGRAMMABLE READ ONLY MEMORY AND PROGRAMMING METHOD THEREOF

(75) Inventors: Wen-Hao Ching, Hsinchu County (TW); Shih-Chen Wang, Taipei (TW); Tsung-Mu Lai, Hsinchu County (TW)

(73) Assignee: eMemory Technology Inc., Hsinchu (TW)

( * ) Notice: Subject to any disclaimer, the term of this patent is extended or adjusted under 35 U.S.C. 154(b) by 91 days.

(21) Appl. No.: 12/423,810

(22) Filed: Apr. 15, 2009

(65) Prior Publication Data

US 2010/0265755 A1   Oct. 21, 2010

(51) Int. Cl.
*G11C 17/00* (2006.01)
*H01L 27/08* (2006.01)
(52) U.S. Cl. .................. 365/96; 365/104; 365/105; 257/392; 257/E27.102
(58) Field of Classification Search ................ 365/96
See application file for complete search history.

(56) References Cited

U.S. PATENT DOCUMENTS

| | | | |
|---|---|---|---|
| 3,641,516 A | 2/1972 | Castrucci et al. | |
| 5,019,878 A * | 5/1991 | Yang et al. | 257/390 |
| 5,847,441 A | 12/1998 | Cutter et al. | |
| 5,847,988 A | 12/1998 | Babson et al. | |
| 5,851,882 A * | 12/1998 | Harshfield | 438/275 |
| 5,852,323 A | 12/1998 | Conn | |
| 5,905,670 A | 5/1999 | Babson et al. | |
| 5,973,380 A | 10/1999 | Cutter et al. | |
| 6,184,089 B1 * | 2/2001 | Chang | 438/266 |
| 7,489,535 B2 * | 2/2009 | Mallikararjunaswamy | 365/96 |
| 7,660,144 B2 * | 2/2010 | Bhattacharyya | 365/105 |
| 2005/0179133 A1 * | 8/2005 | Iwasaki et al. | 257/758 |
| 2008/0019165 A1 * | 1/2008 | Lin et al. | 365/102 |
| 2010/0006924 A1 * | 1/2010 | Chen et al. | 257/326 |

* cited by examiner

*Primary Examiner*—Son L Mai
(74) *Attorney, Agent, or Firm*—Jianq Chyun IP Office

(57) ABSTRACT

A one time programmable read only memory disposed on a substrate of a first conductive type is provided. A gate structure is disposed on the substrate. A first doped region and a second doped region are disposed in the substrate at respective sides of the gate structure, and the first doped region and the second doped region are of a second conductive type which is different from the first conductive type. A third doped region of the first conductive type is disposed in the substrate and is adjacent to the second doped region, and a junction is formed between the third doped region and the second doped region. A metal silicide layer is disposed on the substrate. An clearance is formed in the metal silicide layer, and the clearance at least exposes the junction.

22 Claims, 10 Drawing Sheets

ONE TIME PROGRAMMABLE READ ONLY MEMORY AND PROGRAMMING METHOD THEREOF

BACKGROUND OF THE INVENTION

1. Field of the Invention

The present invention generally relates to a semiconductor device, in particular, to a one time programmable read only memory (OTPROM) and a programming method thereof.

2. Description of Related Art

A non-volatile memory device has been widely adopted in personal computers and electronic devices due to the advantages of retaining the stored data even after a power applied on the non-volatile memory device is turned off. Generally, non-volatile memories are classified into an erasable programmable read only memory (EPROM), an electrically erasable programmable read only memory (EEPROM), a mask read only memory (Mask ROM), a one time programmable read only memory (OTPROM), and the like.

The EPROM and EEPROM are both better choices in practice, due to their recordable and erasable capabilities. However, the manufacturing processes of the EPROM and the EEPROM are relatively complex and they have a higher manufacturing cost.

As for the Mask ROM, although the manufacturing process thereof is relatively simple and has a low cost, a mask is required to define the data to be written. Thus, there are many limitations in use.

As for the OTPROM, since data is written therein after the memory left the factory, that is, data can be written therein by a user according to the configuration environment of the memory, the OTPROM is more convenient than the Mask ROM in use. In recent years, the OTPROM has become an indispensable element in semiconductor integrated circuit (IC) devices. The OTPROM can be widely used in, for example, redundancy application of a high-density memory such as a dynamic random access memory (DRAM) or a static random access memory (SRAM), tuning of an analog circuit, storage of a code such as an encryption key, and chip ID for storing management information such as a log in a manufacturing process.

U.S. Pat. No. 5,847,441 and U.S. Pat. No. 5,973,380 disclose semiconductor junction antifuse circuits and devices. In U.S. Pat. No. 5,847,441 and U.S. Pat. No. 5,973,380, one junction antifuse is blown by applying a breakdown voltage and current flows across the reverse-biased junction to cause dopant migration forms a conductive path. U.S. Pat. No. 5,852,323 discloses an electrically programmable antifuse using metal penetration of a P-N junction. In U.S. Pat. No. 5,852,323, one necked-down junction antifuse is programmed by reverse-bias voltage and current heats the necked-down region to create a hot filament between metal contacts. U.S. Pat. No. 3,641,516 discloses a write once read only store semiconductor memory. In U.S. Pat. No. 3,641,516, the write once read only store semiconductor memory including back-to-back diode is programmed by fusing current to cause a metal-semiconductor alloy to form and short out the reverse diode.

As the semiconductor technology steps into a deep sub-micron manufacturing process, the size of the device is gradually reduced, and correspondingly, as for a memory device, the size of memory cells becomes increasingly small. On the other hand, as the information electronic products (such as computers, mobile phones, digital cameras, and personal digital assistants (PDAs)) have to handle and store increasingly more data, the memory required to be configured in these information electronic products has to have an increasingly large capacity. In the case of requiring a reduced size and an increased capacity of a memory, it has become a common goal in this field to manufacture memory devices with reduced sizes and high integration levels while maintaining desirable qualities.

SUMMARY OF THE INVENTION

Accordingly, the present invention is directed to a one time programmable read only memory (OTPROM) manufactured by and fully compatible with an existing process which not only increases the device integration level, but also effectively reduces the manufacturing cost.

The present invention is further directed to a programming method of a one time programmable read only memory (OTPROM), which can program an OTPROM by simple operations and can store data correctly.

As embodied and broadly described herein, the present invention provides a one time programmable read only memory (OTPROM) disposed on a substrate of a first conductive type. The OTPROM includes a gate structure, a first doped region, a second doped region, a third doped region, and a metal silicide layer. The gate structure is disposed on the substrate. The first doped region and the second doped region are disposed in the substrate at respective sides of the gate structure, and the first doped region and the second doped region are of a second conductive type different from the first conductive type. The third doped region of the first conductive type is disposed in the substrate and is adjacent to the second doped region, and a junction is formed between the third doped region and the second doped region. The metal silicide layer is disposed on the substrate. The metal silicide layer is opened with a first clearance, and the first clearance at least exposes the junction.

In an embodiment of the present invention, the clearance is defined by a silicide blocking layer. The silicide blocking layer is disposed on the substrate, and covering across the junction, and the junction is therefore exposed from the second and the third silicide layers.

In an embodiment of the present invention, the OTPROM further includes a silicide-blocking structure. The silicide-blocking structure is composed of a first conductive layer, a second conductive layer, a first spacer, and a second spacer. The first and the second conductive layers apart from each other with a second clearance are disposed on the substrate and cover across the junction between the second and the third doped regions. The first and the second spacers are disposed at a sidewall of the first and the second conductive layers, respectively.

In an embodiment of the present invention, the second clearance is large enough to separate the first and the second spacers to expose the junction to the silicide formation process.

In an embodiment of the present invention, the second clearance is small enough to merge the first and the second spacers to hide the junction from the silicide formation process.

In an embodiment of the present invention, the silicide-blocking structure further includes a dielectric layer. The dielectric layer is disposed between the conductive layers and the doped regions.

In an embodiment of the present invention, the silicide-blocking structure further includes a silicide blocking layer. The silicide-blocking structure is surrounded by the silicide blocking layer.

In an embodiment of the present invention, the silicide-blocking structure is isolated not to be applied with external voltage sources.

In an embodiment of the present invention, the OTPROM further includes a spacer disposed at a sidewall of the gate structure.

In an embodiment of the present invention, the gate structure includes a gate and a gate dielectric layer. The gate is disposed on the substrate. The gate dielectric layer is disposed between the gate and the substrate In an embodiment of the present invention, the second doped region and the third doped region constitute a diode.

In an embodiment of the present invention, the second doped region and the third doped region are arranged to form butted patterns.

In an embodiment of the present invention, a part of the second doped region and the third doped region are overlapped.

In an embodiment of the present invention, the second doped region and the third doped region are separated by a distance.

In an embodiment of the present invention, the gate structure, the first doped region, and the second doped region constitute a transistor.

The present invention further provides a programming method of a one time programmable read only memory (OTPROM). The OTPROM includes a transistor and a diode connected in series and a metal silicide layer disposed on a substrate. The transistor includes a gate, a source region, and a drain region. The diode is formed by the source region and a doped region. The metal silicide layer is opened with a clearance, and the clearance at least exposes a junction between the source region and the doped region. The programming method of an OTPROM includes applying a first voltage to the gate, applying a second voltage to the drain region, and applying a third voltage to the doped region. The first voltage is sufficient for turning on a channel of the transistor. The second voltage provides a sufficient reverse bias to the junction between the source region and the doped region to result in a high reverse current flow through and bridge the diode.

In an embodiment of the present invention, the first voltage is 2 V to 15 V, and various with respect to applied process.

In an embodiment of the present invention, the second voltage is 1 V to 10 V.

In an embodiment of the present invention, the third voltage is 0 V.

In an embodiment of the present invention, the programming method of an OTPROM further includes applying a fourth voltage to the substrate.

In an embodiment of the present invention, the fourth voltage is 0 V.

The OTPROM provided in the present invention can effectively store data. The OTPROM can be manufactured by an existing process, which not only increases the device integration level, but also effectively reduces the manufacturing cost.

The OTPROM in the present invention is formed by a transistor and a diode connected in series, and the diode is formed by the source region of the transistor and a doped region with a conductive type different from that of the source region. In addition, no metal silicide layer is formed above the P-N junction between the source region and the doped region. Thus, a breakdown (comes from Zener effect) of the diode is caused by providing a sufficient reverse bias between the source region and the doped region. At this time, the metal silicide on the source region and the doped region produces a bridge effect, and thus connects the source region with the doped region through a resistance lower than an initial state, thereby resulting in a short circuit of the diode. The OTPROM of the present invention can achieve a programming purpose through simple operations. Moreover, the OTPROM in the present invention can also store data correctly without damages on the cell during programming operations, since the transistor can effectively control the flowing of the current.

BRIEF DESCRIPTION OF THE DRAWINGS

The accompanying drawings are included to provide a further understanding of the invention, and are incorporated in and constitute a part of this specification. The drawings illustrate embodiments of the invention and, together with the descriptions, serve to explain the principles of the invention.

DESCRIPTION OF THE EMBODIMENTS

Figure 1A:
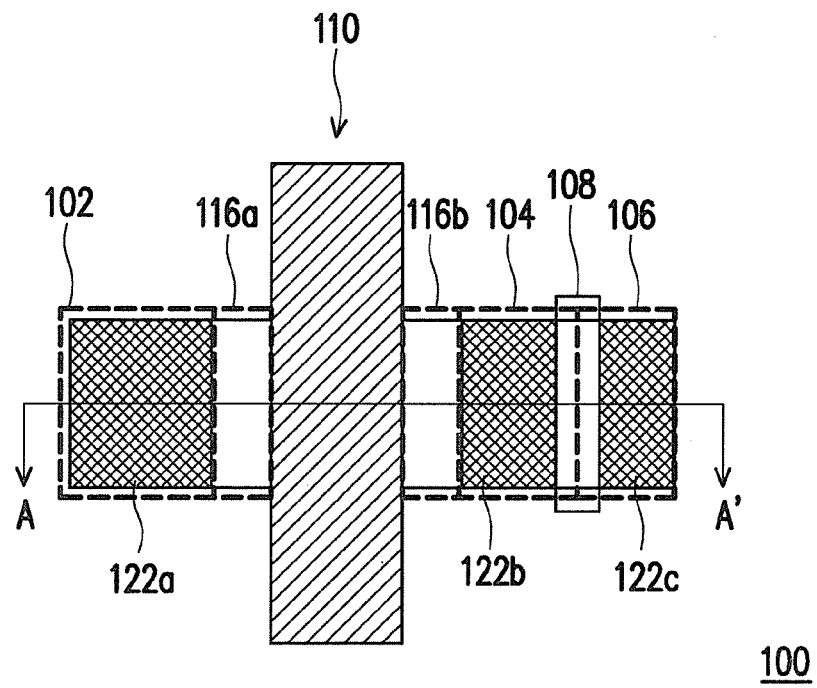
FIG. 1A is a top view of an OTPROM according to an embodiment of the present invention.

References will now be made in detail to the present embodiments of the invention, examples of which are illustrated in the accompanying drawings. Wherever possible, the same reference numbers are used in the drawings and the description to refer to the same or like parts.

Firstly, a one time programmable read only memory (OTPROM) of the present invention is illustrated.

Figure 1B:
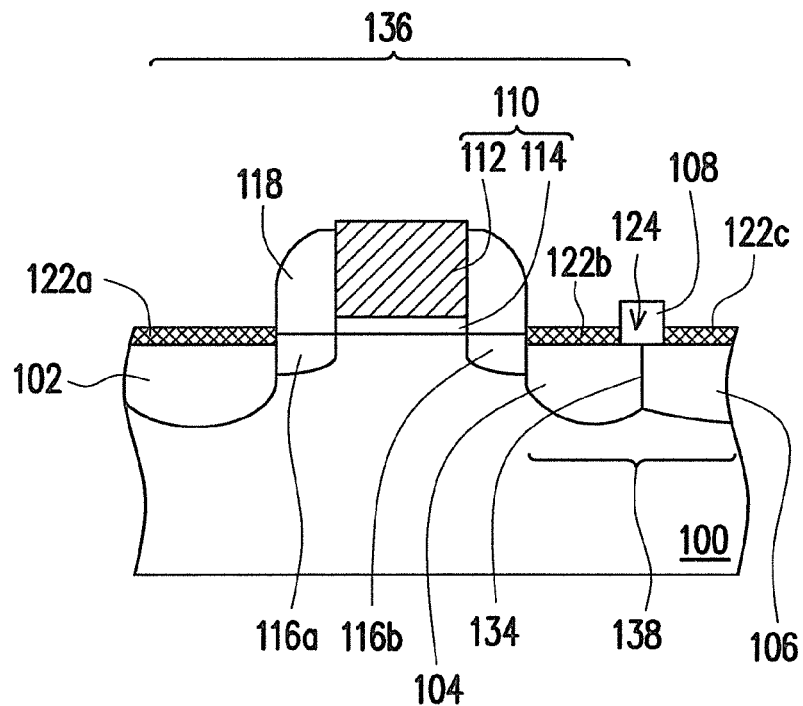
FIG. 1B is a cross-sectional view of FIG. 1A, taken along a line A-A' in FIG. 1A.

FIG. 1A is a top view of an OTPROM according to an embodiment of the present invention. FIG. 1B is a cross-sectional view of FIG. 1A, taken along a line A-A' in FIG. 1A.

Referring to FIGS. 1A and 1B, an OTPROM includes a substrate 100, a doped region 102, a doped region 104, a doped region 106, a gate structure 110 (a gate 112 and a gate dielectric layer 114), a lightly doped region 116a, a lightly doped region 116b, a spacer 118, a metal silicide layer 122a, a metal silicide layer 122b, a metal silicide layer 122c.

The substrate 100 includes a semiconductor substrate such as a silicon substrate. The substrate 100 is, for example, of a first conductive type.

The gate structure 110 is disposed on the substrate 100. The gate structure 110 includes the gate 112 and the gate dielectric layer 114. The gate dielectric layer 114 is disposed between the gate 112 and the substrate 100. The gate dielectric layer 114 is, for example, made of silicon oxide. The gate 112 is disposed on the gate dielectric layer 114. The gate 112 is, for example, made of a metal or doped polysilicon.

The doped region 102 and the doped region 104 are disposed in the substrate 100 at respective sides of the gate structure 110. The doped region 102 and the doped region 104 are made of a second conductive type different from the first conductive type. The first conductive type and the second conductive type are respectively an N type or a P type. In this embodiment, the first conductive type is, for example, a P type, and accordingly, the second conductive type is an N type. N type dopants include Group V elements in the periodic table such as phosphorus (P), arsenic (As), and antimony (Sb). P type dopants include Group III elements in the periodic table such as boron (B), gallium (Ga), and indium (In). Dopant concentrations in the doped region 102 and the doped region 104 are, for example, $1 \times 10^{19} \sim 1 \times 10^{22}$ atoms/cm$^3$. The gate structure 110, the doped region 102, and the doped region 104 constitute a transistor 136. The doped region 102 serves as a drain of the transistor and the doped region 104 serves as a source of the transistor.

The transistor 136 may optionally include the spacer 118, the lightly doped region 116a, and the lightly doped region 116b. The spacer 118 is disposed at a sidewall of the gate structure 110. The spacer 118 is made of, for example, an isolating material such as silicon nitride. The lightly doped region 116a and the lightly doped region 116b are respectively disposed below the spacer 118 and are respectively adjacent to the doped region 102 and the doped region 104. The lightly doped region 116a and the lightly doped region 116b are of the second conductive type. That is, the lightly doped region 116a and the lightly doped region 116b are of the same conductive type as the doped region 102 and the doped region 104. However, dopant concentrations in the lightly doped region 116a and the lightly doped region 116b are lower than that in the doped region 102 and the doped region 104. The dopant concentrations in the lightly doped region 116a and the lightly doped region 116b are, for example, $1 \times 10^{17}$ atoms/cm$^3$ or higher.

The doped region 106 is of the first conductive type and disposed in the substrate 100. The doped region 106 is adjacent to the doped region 104, and the conductive type of the doped region 106 is different from that of the doped region 104, so that a P-N junction 134 is formed between the doped region 106 and the doped region 104, thereby constituting a diode 138. A dopant concentration in the doped region 106 is, for example, $1 \times 10^{19} \sim 1 \times 10^{22}$ atoms/cm$^3$. Therefore, the OTPROM of the present invention is at least formed by a transistor 136 and a diode 138 connected in series. The diode 138 is, for example, a Zener diode.

The metal silicide layers 122a, 122b, and 122c are disposed on the substrate 100. The metal silicide layers 122b and 122c are apart from each other with a clearance 124 by utilizing a silicide blocking layer 108 covering across the P-N junction 134. The silicide blocking layer 108 is, for example, made of silicon oxide. The metal silicide layers 122a, 122b, and 122c are made of, for example, titanium silicide, tungsten silicide, tantalum silicide, molybdenum silicide, cobalt silicide, or nickel silicide. In this embodiment, the metal silicide layer 122a covers a surface of the doped region 102. The metal silicide layer 122b and the metal silicide layer 122c cover a portion of surfaces of the doped region 104 and the doped region 106 respectively, and the clearance 124 exposes the P-N junction 134. That is, no metal silicide layer 122 is formed above the P-N junction 134.

Figure 2A:
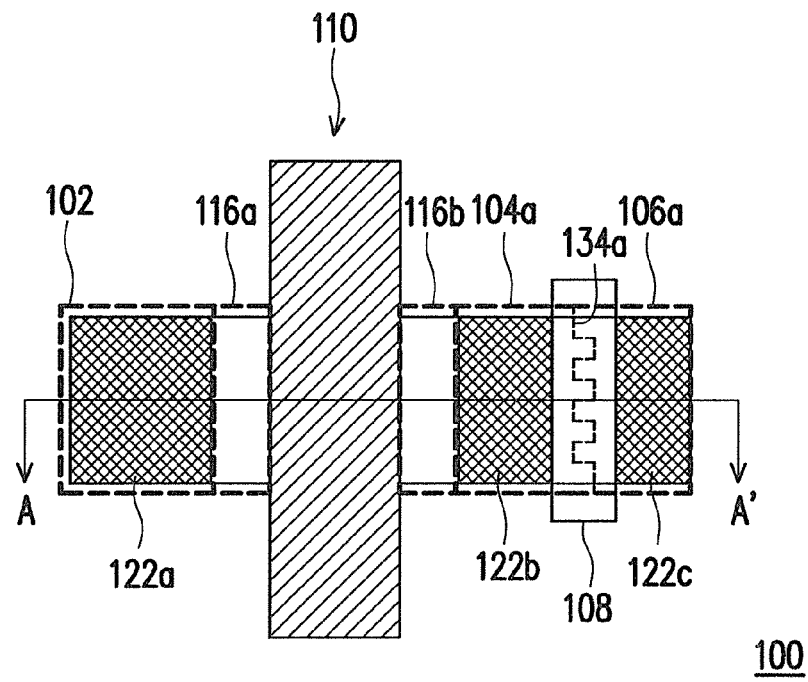
FIG. 2A is a top view of an OTPROM according to another embodiment of the present invention.
Figure 2B:
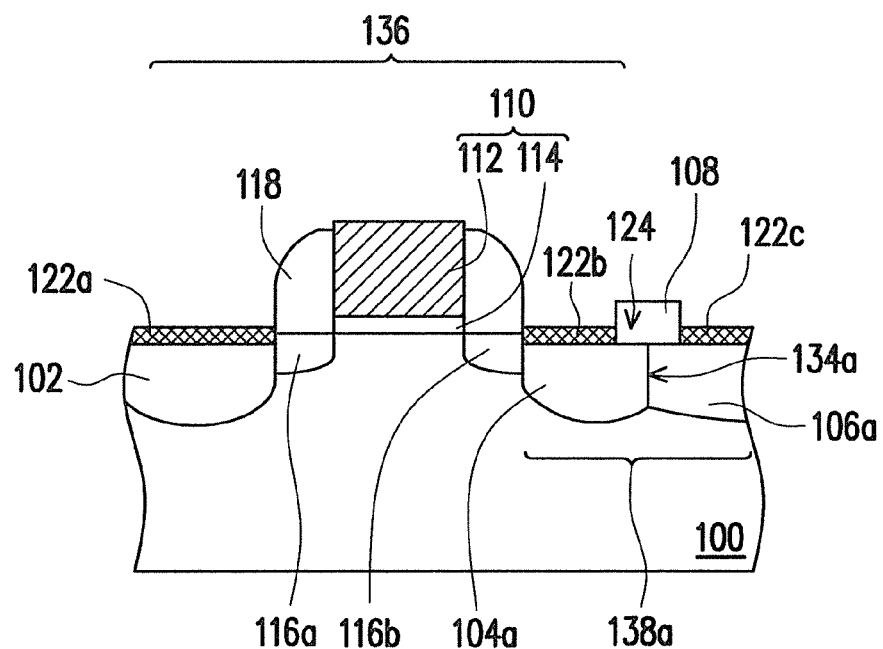
FIG. 2B is a cross-sectional view of FIG. 2A, taken along a line A-A' in FIG. 2A.

FIG. 2A is a top view of an OTPROM according to another embodiment of the present invention. FIG. 2B is a cross-sectional view of FIG. 2A, taken along a line A-A' in FIG. 2A. Those components in FIGS. 2A and 2B the same as that in FIGS. 1A and 1B are represented by the same reference numerals, and detailed descriptions thereof are omitted here.

Referring to FIGS. 2A and 2B, the doped region 106a is of the first conductive type and disposed in the substrate 100. The doped region 106a is adjacent to the doped region 104a, and the conductive type of the doped region 106a is different from that of the doped region 104a, so that a P-N junction 134a is formed between the doped region 106a and the doped region 104a, thereby constituting a diode 138a. The doped region 106a and the doped region 104a are arranged to form butted patterns.

Figure 3A:
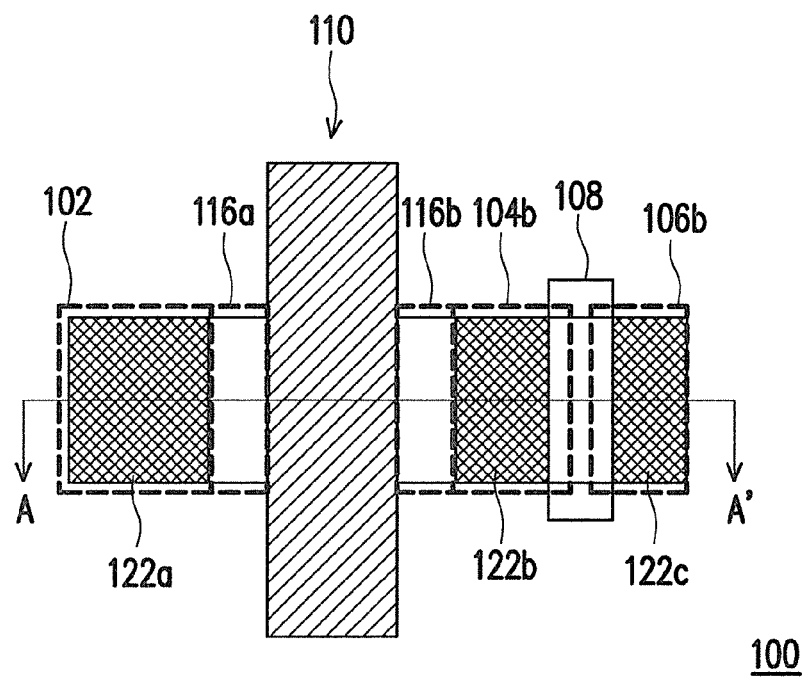
FIG. 3A is a top view of an OTPROM according to another embodiment of the present invention.
Figure 3B:
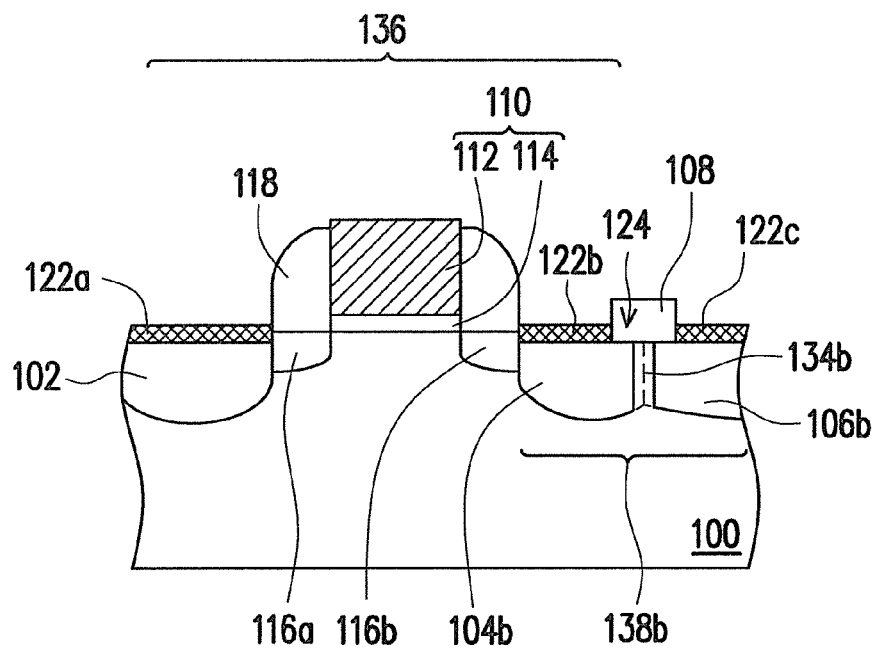
FIG. 3B is a cross-sectional view of FIG. 3A, taken along a line A-A' in FIG. 3A.

FIG. 3A is a top view of an OTPROM according to another embodiment of the present invention. FIG. 3B is a cross-sectional view of FIG. 3A, taken along a line A-A' in FIG. 3A. Those components in FIGS. 3A and 3B the same as that in FIGS. 1A and 1B are represented by the same reference numerals, and detailed descriptions thereof are omitted here.

Referring to FIGS. 3A and 3B, the doped region 106b is of the first conductive type and disposed in the substrate 100. The doped region 106b is disposed to separate away from the doped region 104b with a distance, and the conductive type of the doped region 106b is different from that of the doped region 104b, so that a P-N junction 134b is formed between the doped region 106b and the doped region 104b, thereby constituting a diode 138b.

Figure 4A:
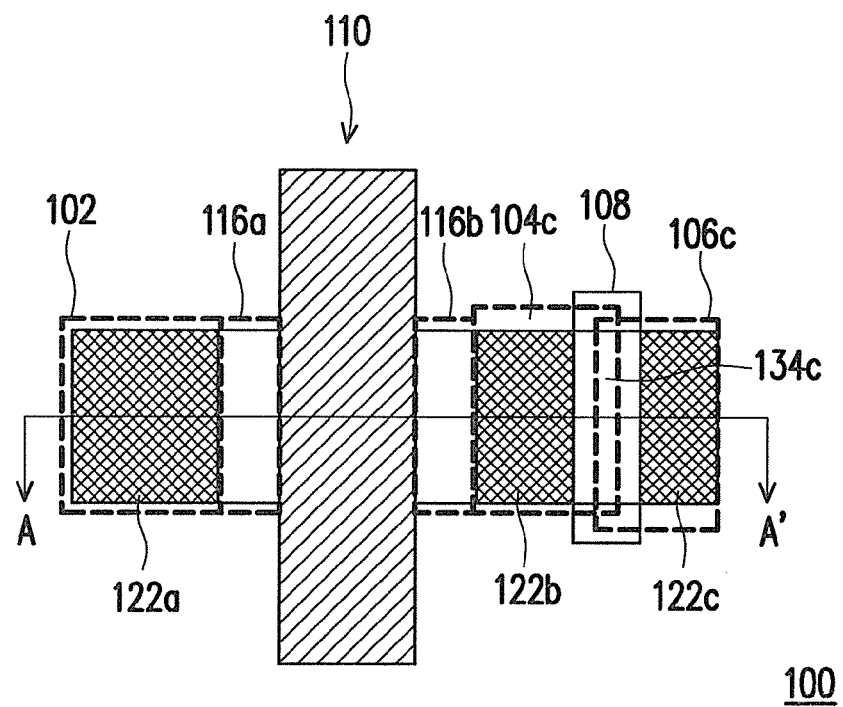
FIG. 4A is a top view of an OTPROM according to another embodiment of the present invention.
Figure 4B:
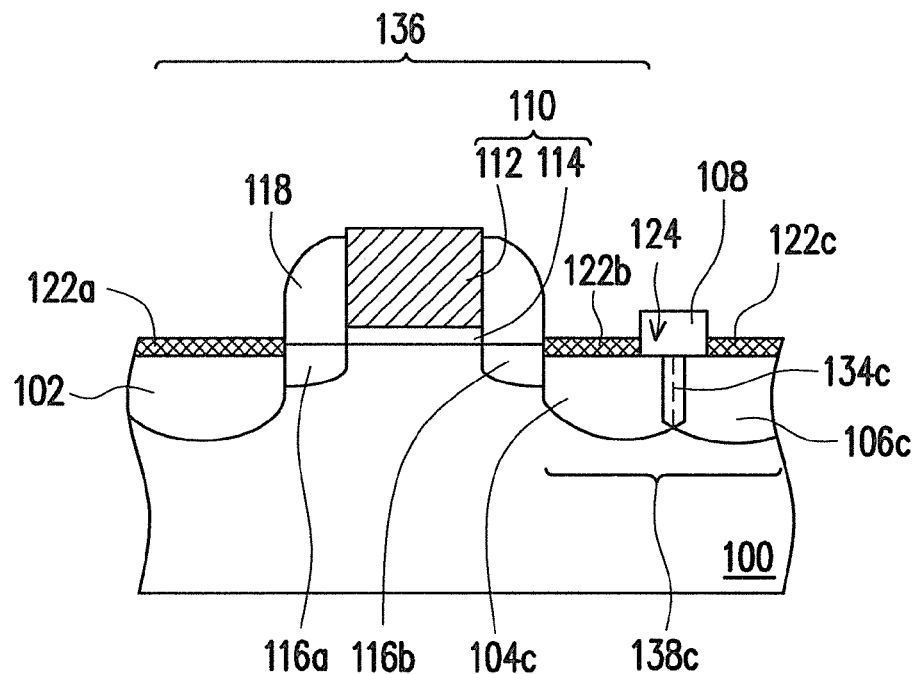
FIG. 4B is a cross-sectional view of FIG. 4A, taken along a line A-A' in FIG. 4A.

FIG. 4A is a top view of an OTPROM according to another embodiment of the present invention. FIG. 4B is a cross-sectional view of FIG. 4A, taken along a line A-A' in FIG. 4A. Those components in FIGS. 4A and 4B the same as that in FIGS. 1A and 1B are represented by the same reference numerals, and detailed descriptions thereof are omitted here.

Referring to FIGS. 4A and 4B, the doped region 106c is of the first conductive type and disposed in the substrate 100. A part of the doped region 106c is disposed to overlap with the doped region 104c, and the conductive type of the doped region 106c is different from that of the doped region 104c, so that a P-N junction 134c is formed between the doped region 106c and the doped region 104c, thereby constituting a diode 138c.

Figure 5A:
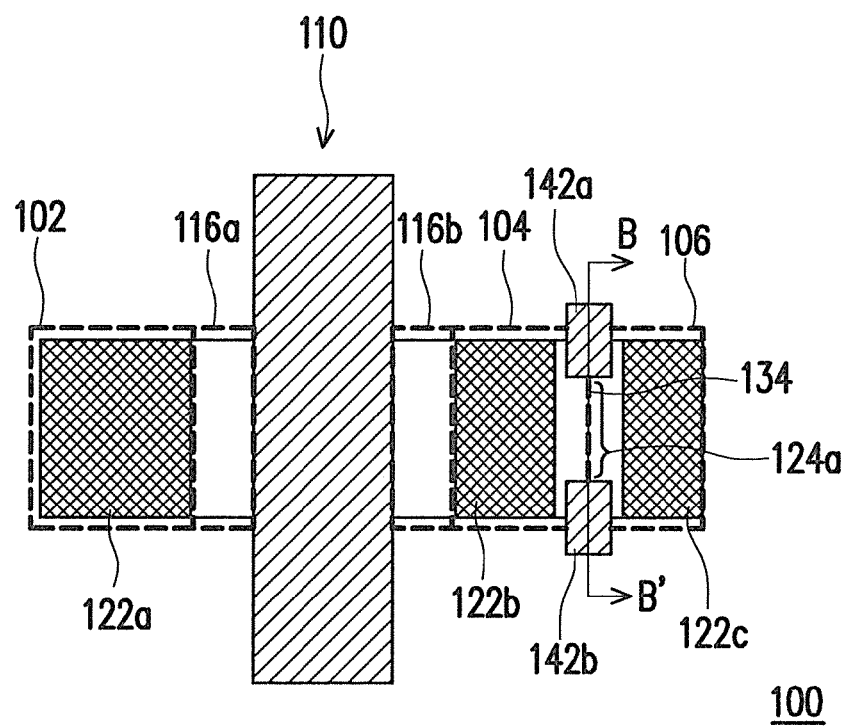
FIG. 5A is a top view of an OTPROM according to another embodiment of the present invention.
Figure 5B:
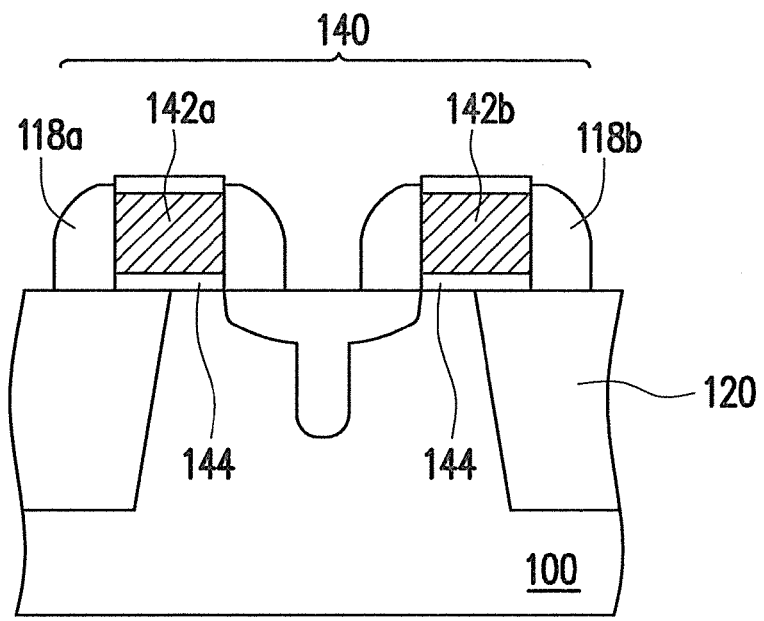
FIG. 5B is a cross-sectional view of FIG. 5A, taken along a line B-B' in FIG. 5A.

FIG. 5A is a top view of an OTPROM according to another embodiment of the present invention. FIG. 5B is a cross-sectional view of FIG. 5A, taken along a line B-B' in FIG. 5A. Those components in FIGS. 5A and 5B the same as that in FIGS. 1A and 1B are represented by the same reference numerals, and detailed descriptions thereof are omitted here.

Referring to FIGS. 5A and 5B, the OTPROM further includes a silicide-blocking structure 140. The silicide-blocking structure 140 is disposed on the substrate 100 and covering across the junction 134. An isolation structure 120 is disposed in substrate 100 to define active areas. The isolation structure 120 is, for example, a shallow-trench isolation structure. Definitely, the isolation structure 120 may also be a field oxide layer.

The silicide-blocking structure 140 is composed of a first conductive layer 142a, a second conductive layer 142b, a first spacer 118a, and a second spacerl 18b. The first conductive layer 142a and the second conductive layer 142b are apart from each other with a clearance 124a. The conductive layers 142a and 142b are, for example, made of a metal or doped polysilicon.

The first spacer 118a and the second spacer 118b are disposed at a sidewall of the first conductive layer 142a and the second conductive layer 142b, respectively. The spacers 118a and 118b are made of, for example, an isolating material such as silicon nitride.

The first conductive layer 142a and the second conductive layer 142b are arranged to enlarge the clearance 124a to separate the first space 118a and the second spacer 118b to expose the junction 134.

The silicide-blocking structure 140 further includes a dielectric layer 144. The dielectric layer 144 is disposed between the conductive layers 142a, 142b and the doped regions 104 and 106. The dielectric layer 144 is, for example, made of silicon oxide. The silicide-blocking structure 140 is isolated not to be applied with external voltage sources.

Figure 6A:
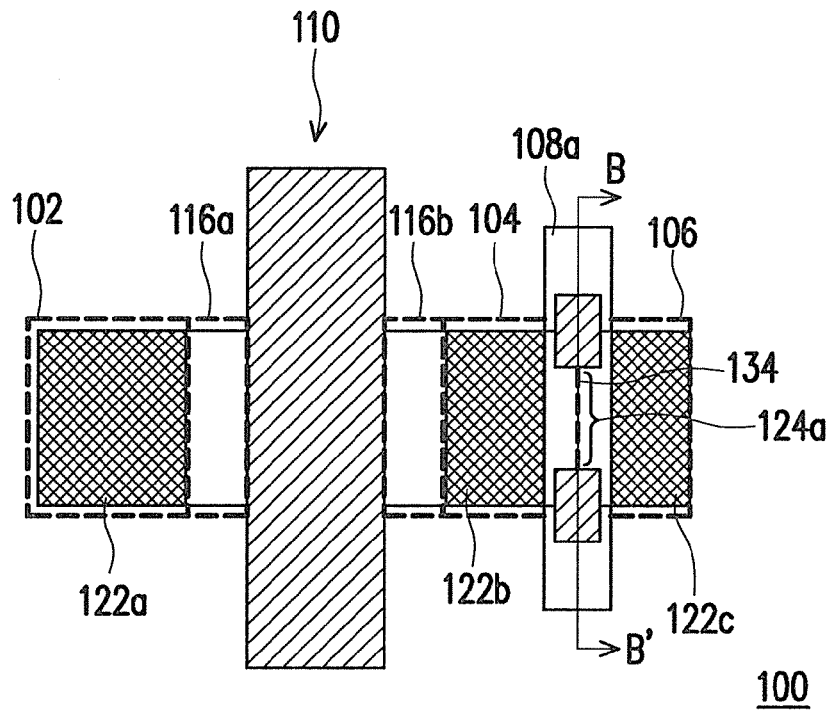
FIG. 6A is a top view of an OTPROM according to another embodiment of the present invention.
Figure 6B:
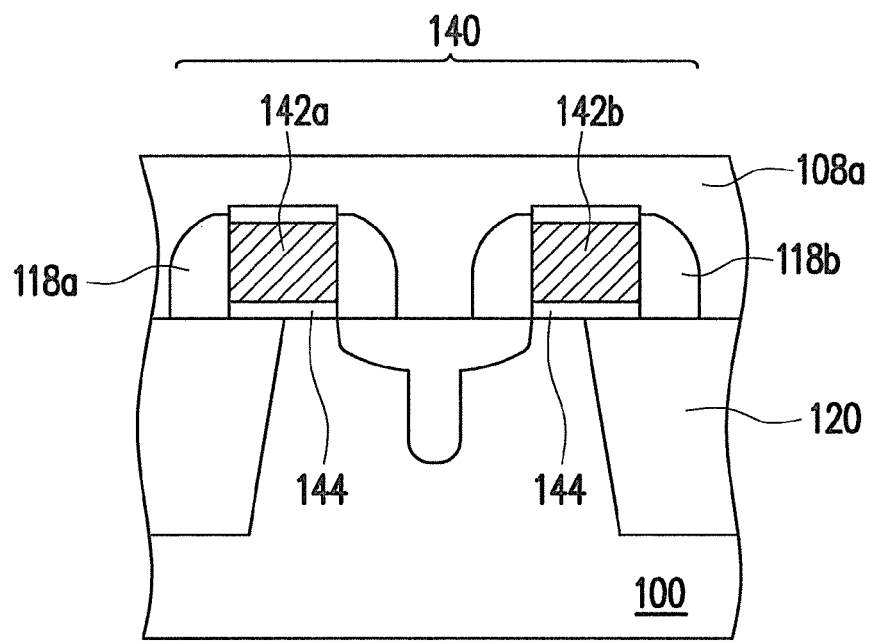
FIG. 6B is a cross-sectional view of FIG. 6A, taken along a line B-B' in FIG. 6A.

FIG. 6A is a top view of an OTPROM according to another embodiment of the present invention. FIG. 6B is a cross-sectional view of FIG. 6A, taken along a line B-B' in FIG. 6A. Those components in FIGS. 6A and 6B the same as that in FIGS. 5A and 5B are represented by the same reference numerals, and detailed descriptions thereof are omitted here.

Referring to FIGS. 6A and 6B, the silicide-blocking structure 140 further includes a silicide blocking layer 108a. The silicide blocking layer 108a is disposed on the substrate 100, and the silicide-blocking structure 140 is surrounded by the silicide blocking layer 108a.

Figure 7A:
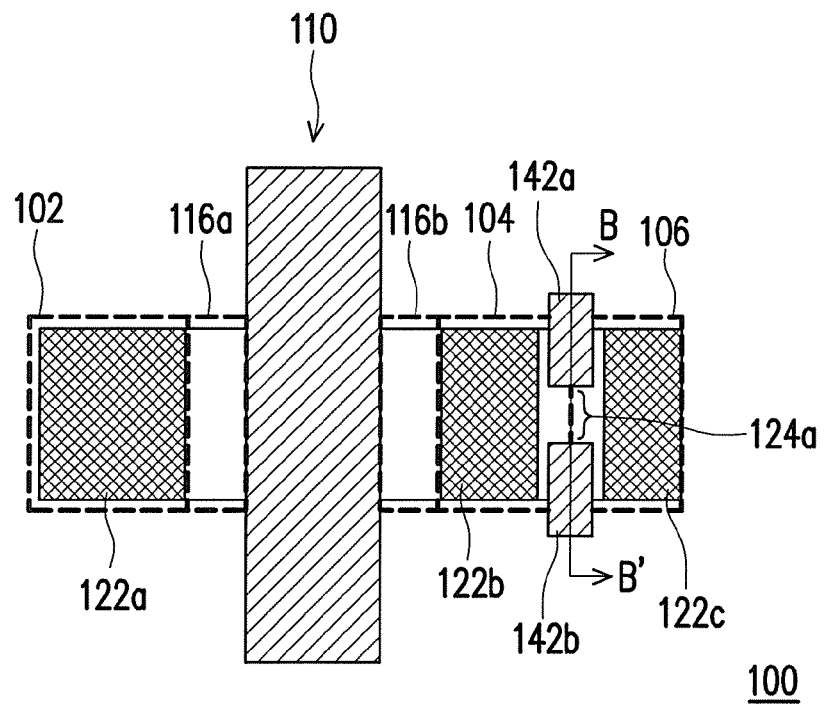
FIG. 7A is a top view of an OTPROM according to another embodiment of the present invention.
Figure 7B:
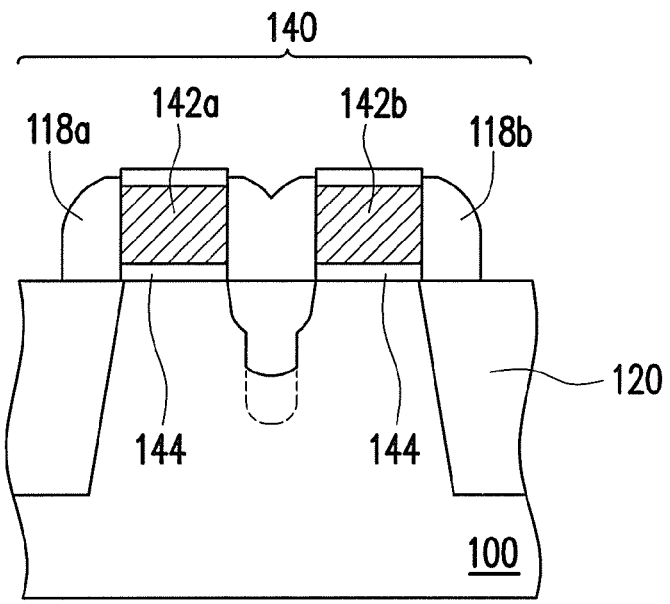
FIG. 7B is a cross-sectional view of FIG. 7A, taken along a line B-B' in FIG. 7A.

FIG. 7A is a top view of an OTPROM according to another embodiment of the present invention. FIG. 7B is a cross-sectional view of FIG. 7A, taken along a line B-B' in FIG. 7A. Those components in FIGS. 7A and 7B the same as that in FIGS. 5A and 5B are represented by the same reference numerals, and detailed descriptions thereof are omitted here.

Referring to FIGS. 7A and 7B, the first conductive layer 142a and the second conductive layer 142b are arranged to reduce the clearance 124a to merge the first space and the second spacer to hide the junction 134.

In the OTPROM of the present invention, since the doped region 104 (104a~104c) and the doped region 106 (106a~106c) could be made both heavily doped, the heavy doped regions (for example, dopant concentrations thereof are more than $1 \times 10^{17}$ atoms/cm$^3$) make a depletion layer become extremely thin, and as a result, a Zener effect easily occurs on the heavily doped P-N junction 134 (134a~134c). A current flow is generated by quantum mechanical tunneling through the depletion layer.

Moreover, the metal silicide layers 122b and 122c are not formed above the P-N junction 134 between the doped region 104 and the doped region 106. A first voltage is applied to the gate 112 to turn on a channel of the transistor 136, a second voltage is applied to the doped region 102, and a third voltage is applied to the doped region 106. The second voltage is conducted to the doped region 104 via the channel of the transistor 136, where the doped region 104 is electrically floated. If there is a sufficient reverse bias between the doped region 104 and the doped region 106 to cause a Zener effect of the diode 138, some current starts flowing through a path between the doped region 104 and the doped region 106. When the current is large enough, a self-heating process is continuously increased on this path, until the heat dissipates. In the self-heating process, when a junction temperature reaches a critical point, the metal silicide layer 122b and 122c starts melting, and flows along a current path in the direction where the current flows. As the process proceeds, the metal silicide layer 122b and 122c is distributed along the current path between the doped region 104 and the doped region 106. Firstly, a few amount of small metal-silicide particles contribute to mid-gap states in the space-charge regions between doped regions 104 and 106, and then more and more metal-silicide particles start piling up along the current path, and then gradually connects the doped region 104 with the doped region 106 through a melted-silicide resistance lower than the initial state of the diode, which is the so-called metal silicide bridging. Such operations result in resistive short-circuit of the diode 138, with the helps of the mid-gap states through trap-assist tunneling effect or the bridged silicide, thereby achieving the programming purpose.

Moreover, the transistor 136 can effectively control the flowing of the current, which is helpful for storing data correctly. When the OTPROM is being read, the transistor 136 can also prevent incorrect judgment of the data.

On the other hand, the OTPROM of this embodiment can be manufactured through an existing process without additional masks, which is compatible with the existing process.

Figure 8A:
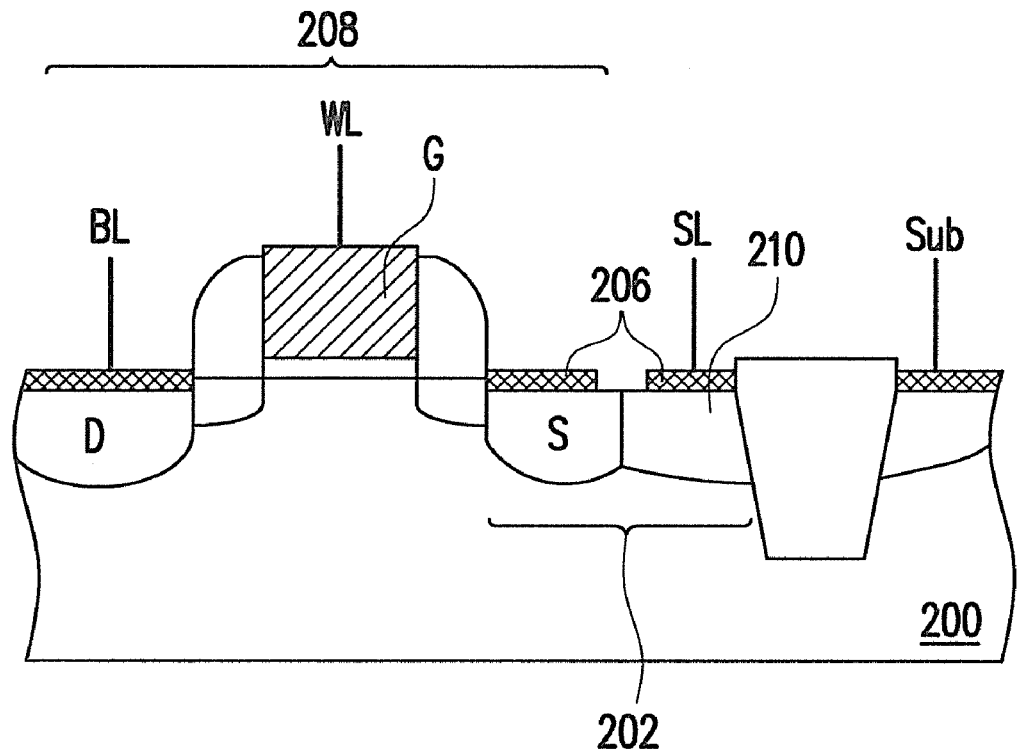
FIG. 8A is a cross-sectional structural view of an OTPROM before programming according to an embodiment of the present invention.
Figure 8B:
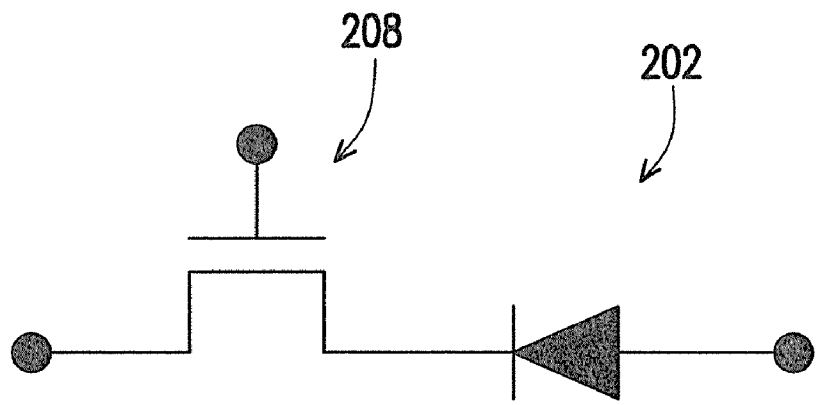
FIG. 8B is an equivalent circuit diagram of the OTPROM of FIG. 3A.
Figure 9A:
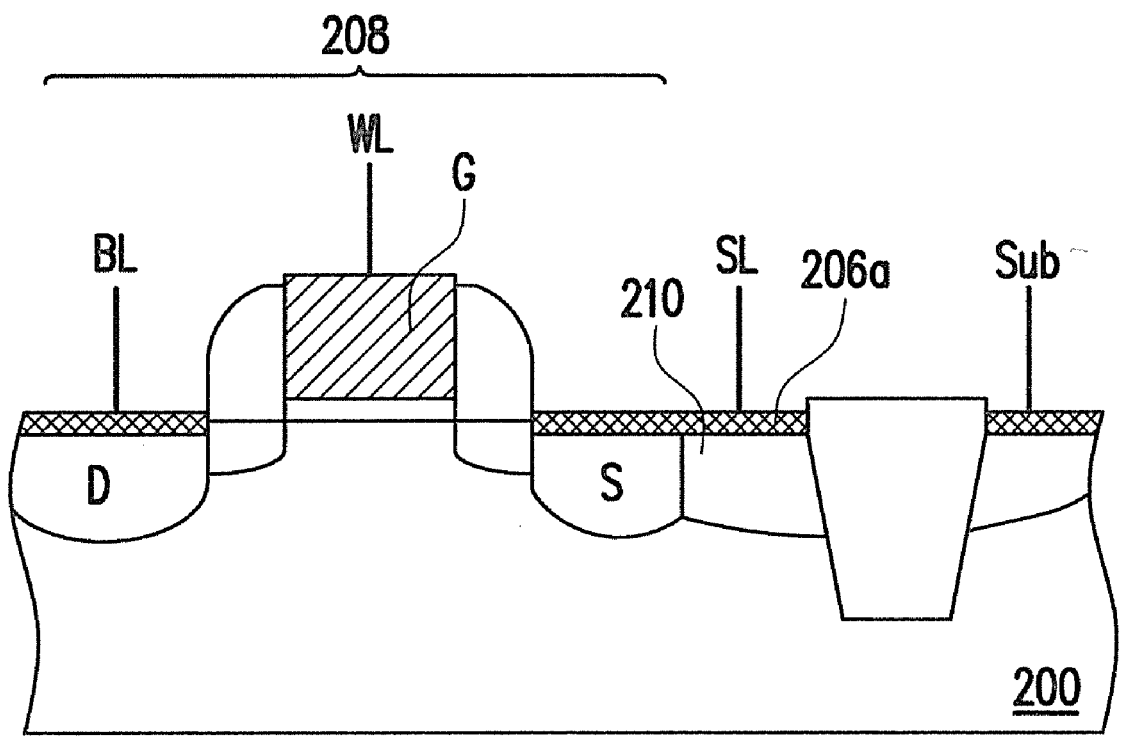
FIG. 9A is a cross-sectional structural view of an OTPROM after programming according to an embodiment of the present invention.
Figure 9B:
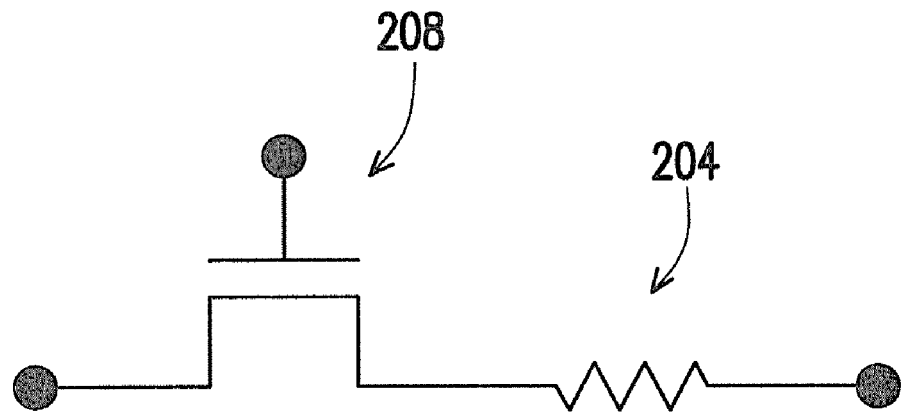
FIG. 9B is an equivalent circuit diagram of the OTPROM of FIG. 4A.

FIG. 8A is a cross-sectional structural view of an OTPROM before programming according to an embodiment of the present invention. FIG. 8B is an equivalent circuit diagram of the OTPROM of FIG. 8A. FIG. 9A is a cross-sectional structural view of an OTPROM after programming according to an embodiment of the present invention. FIG. 9B is an equivalent circuit diagram of the OTPROM of FIG. 9A.

Referring to FIGS. 8A and 8B, before programming, an OTPROM of the present invention is formed by a transistor 208 and a diode 202 connected in series. Referring to FIGS. 9A and 9B, after programming, in the OTPROM of the present invention, a metal silicide layer on the diode produces a bridging effect, and thus connects a P type doped region with an N type doped region of the diode through a resistance lower than an initial state. Therefore, after programming, the OTPROM of the present invention is formed by the transistor 208 and a resistor 204 connected in series.

Referring to FIG. 8A, when the OTPROM is being programmed, a voltage Vp1 is applied to a gate G (word line WL), a voltage Vp2 is applied to a drain D (bit line BL), and a voltage Vp3 is applied to a doped region 210 (source line SL). A voltage Vp4 is applied to a substrate 200 (Sub). The voltage Vp1 is sufficient for turning on a channel of the transistor 208. The voltage Vp1 is 2 V to 15 V. The voltage Vp2 provides a sufficient reverse bias to a junction between a source region S and the doped region 210, so as to result in a breakdown of the diode. The voltage Vp2 is 1 V to 10 V. The voltage Vp3 is 0 V. The voltage Vp4 is 0 V.

A first voltage is applied to the gate G (word line WL) to turn on a channel of the transistor 208, a second voltage is applied to the drain D (bit line BL), and a third voltage is applied to the doped region 210 (source line SL). The second voltage is conducted to the source S via the channel of the transistor 208, where the source S is electrically floated. If there is a sufficient reverse bias between the source S and the doped region 210 (source line SL) to result in a breakdown of the diode 202, some current starts flowing through a path between the source S and the doped region 210 (source line SL). When the current is large enough, a self-heating process is continuously increased on this path, until the heat dissipates. In the self-heating process, when a junction temperature reaches a critical point, a metal silicide layer 206 between the source S and the doped region 210 (source line SL) starts melting, and flows along a current path in the direction where the current flows. As the process proceeds, the metal silicide layer 206 is distributed along the current path between the source S and the doped region 210 (source line SL), and gradually connects the source S with the doped region 210 (source line SL) through a resistance lower than the initial state, which is so-called metal silicide bridging, so as to form a metal silicide layer 206a as shown in FIG. 9A. Referring to FIG. 9B, after programming, the OTPROM of the present invention is formed by the transistor 208 and the resistor 204 connected in series.

When the OTPROM is being read, a voltage Vr1 is applied to the gate G (word line WL), a voltage Vr2 is applied to the drain D (bit line BL), and a voltage Vr3 is applied to the doped region 210 (source line SL). A voltage Vr4 is applied to the substrate 200 (Sub). The voltage Vr1 is greater than or equal to an threshold voltage of the transistor, and the voltage Vr1 is 1V to 8V. The voltage Vr2 is smaller than a breakdown voltage of the transistor, and the voltage Vr2 is 1V to 3V. The voltage Vr3 is 0 V. The voltage Vr4 is 0 V.

Before programming, the OTPROM of the present invention is connected to a diode in series (FIG. 8A), and after programming, it is connected to a resistor in series (FIG. 8B). Therefore, in the case of the above bias, digital information stored in the OTPROM is determined by detecting the magnitude of the current at the doped region 210 (source line SL).

Figure 10A:
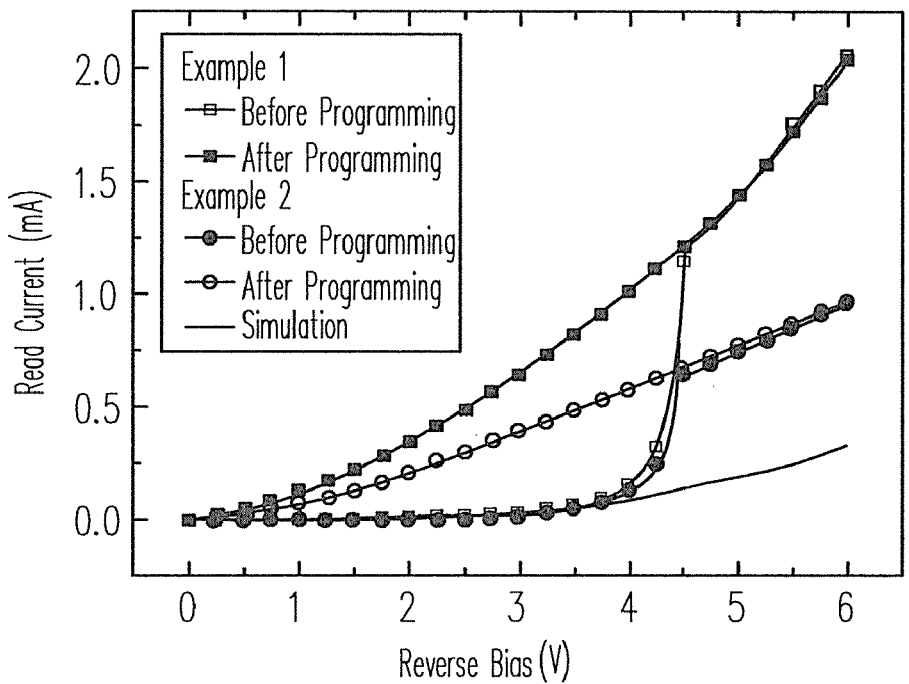
FIGS. 10A and 10B are curve diagrams of relations between a reverse bias and a read current of an OTPROM before and after programming according to the present invention.
Figure 10B:
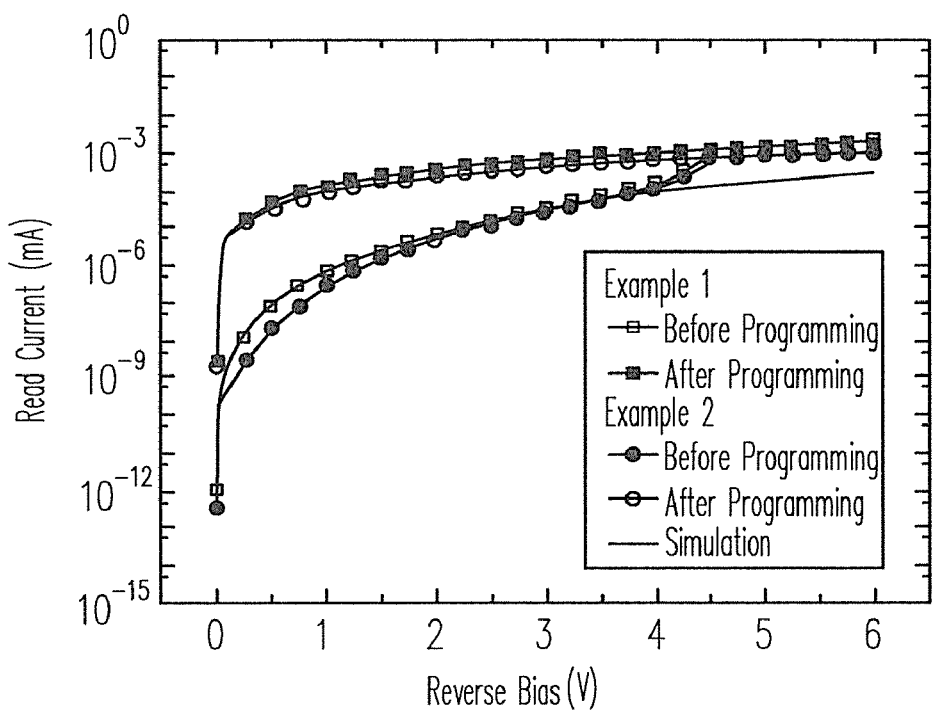

FIGS. 10A and 10B are curve diagrams of relations between a reverse bias and a read current of an OTPROM before and after programming according to the present invention.

In FIGS. 10A and 10B, marks □ represent a curve of a relation between a reverse bias and a read current of an OTPROM in Example 1 before programming, and marks ■ represent a curve of a relation between the reverse bias and the read current of the OTPROM in Example 1 after programming. Marks ○ represent a curve of a relation between a reverse bias and a read current of an OTPROM in Example 2 before programming, and marks ● represent a curve of a relation between the reverse bias and the read current of the OTPROM in Example 2 after programming. Marks - represent a simulation curve of the OTPROM.

Operation conditions of Example 1 and Example 2 are described as follows. The voltage (reverse bias) applied to the drain (for example, the bit line BL in FIG. 8A) is 0 to 6 V, and the voltage applied to the doped region (for example, the source line SL in FIG. 8A) is 0 V. Afterwards, the read current at the initial stage (before programming) and the read current after breakdown (after programming) are measured for each reverse bias.

The results in FIGS. 10A and 10B show that, as for the OTPROM of the present invention, under a fixed reverse bias (the voltage applied to the drain), the read current of the memory after programming is larger than that before programming, so as to determine digital information stored in the OTPROM. Moreover, as shown in FIGS. 10A and 10B, the breakdown voltage of the OTPROM is about 4.5 V, and after a breakdown (comes from Zener effect) of the diode occurs, the resistance characteristics are exhibited. According to the simulation result, it is determined that the breakdown of the diode is caused by the quantum mechanical tunneling current. Therefore, in the reading operation, the voltage applied to the drain D (bit line BL) needs to be smaller than the breakdown voltage of the diode.

The OTPROM provided in the present invention is formed by a transistor and a diode connected in series, and the diode is formed by the source of the transistor and a doped region with a conductive type different from that of the source. In addition, no metal silicide layer is formed above the P-N junction between the source and the doped region. A breakdown of the diode is caused by providing a sufficient reverse bias between the source and the doped region, and the metal silicide on the source and the doped region produces a bridge effect, which results in a short circuit of the diode, thereby achieving the programming purpose.

To sum up, the present invention at least has the following advantages.

1. The OTPROM provided in the present invention can effectively store data.

2. The OTPROM provided in the present invention can be manufactured through an existing process, which not only increases the device integration level, but also effectively reduces the manufacturing cost, especially when an advanced CMOS process is used.

3. The OTPROM provided in the present invention can correctly store data, since the transistor can effectively control the flowing of the current.

4. The OTPROM provided in the present invention is formed by a transistor and a diode connected in series, and the diode is formed by the source of the transistor and a doped region with a conductive type different from that of the source. In addition, no metal silicide layer is formed above a P-N junction between the source and the doped region. A breakdown (comes from Zener effect) of the diode is caused by providing a sufficient reverse bias between the source and the doped region. At this time, the metal silicide on the source and the doped region produces a bridge effect and thus connects the source with the doped region through a resistance lower than the initial state, thereby resulting in a short circuit of the diode. The OTPROM of the present invention can implement programming through simple operations.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A one time programmable read only memory (OTPROM), disposed on a substrate of a first conductive type, comprising:

a gate structure, disposed on the substrate;

a first doped region and a second doped region, disposed in the substrate at respective sides of the gate structure, wherein the first doped region and the second doped region are of a second conductive type different from the first conductive type;

a third doped region, disposed in the substrate and being of the first conductive type, wherein the third doped region is adjacent to the second doped region, and a junction is formed between the third doped region and the second doped region; and a metal silicide layer, disposed on the substrate, wherein the metal silicide layer is opened with a first clearance, and the clearance at least exposes the junction.

2. The OTPROM according to claim 1, further comprising:

a silicide blocking layer, disposed on the substrate and covered across the junction.

3. The OTPROM according to claim 1, further comprising:
a silicide-blocking structure, disposed on the substrate, wherein the silicide-blocking structure covers across the junction.

4. The OTPROM according to claim 3, wherein the silicide-blocking structure comprises:
a first conductive layer and a second conductive layer, disposed on the substrate, wherein the first conductive layer and the second conductive layer are apart from each other with a second clearance; and
a first spacer and a second spacer, disposed at a sidewall of the first conductive layer and the second conductive layer, respectively.

5. The OTPROM according to claim 3, wherein the second clearance is large enough to separate the first spacer and the second spacer to expose the junction.

6. The OTPROM according to claim 3, wherein the second clearance is small enough to merge the first spacer and the second spacer to shield the junction.

7. The OTPROM according to claim 3, wherein the silicide-blocking structure further comprises:
a dielectric layer, disposed between the first and the second conductive layers and the doped regions.

8. The OTPROM according to claim 3, wherein the silicide-blocking structure further comprises:
a silicide blocking layer, disposed on the substrate, wherein the silicide-blocking structure is surrounded by the silicide blocking layer.

9. The OTPROM according to claim 3, wherein the silicide-blocking structure is isolated not to be applied with external voltage sources.

10. The OTPROM according to claim 1, further comprising:
a spacer, disposed at a sidewall of the gate structure.

11. The OTPROM according to claim 1, wherein the gate structure comprises:
a conductive material as gate electrode, disposed on the substrate; and
a gate dielectric layer, disposed between the gate and the substrate.

12. The OTPROM according to claim 1, wherein the second doped region and the third doped region constitute a diode.

13. The OTPROM according to claim 12, wherein the second doped region and the third doped region are arranged to form butted patterns.

14. The OTPROM according to claim 12, wherein a part of the second doped region and the third doped region are overlapped.

15. The OTPROM according to claim 12, wherein the second doped region and the third doped region are separated by a distance.

16. The OTPROM according to claim 1, wherein the gate structure, the first doped region, and the second doped region constitute a transistor.

17. A programming method of a one time programmable read only memory (OTPROM), wherein the OTPROM comprises a transistor, and a diode connected in series with the transistor, and a metal silicide layer disposed on a substrate; where the transistor comprises a gate, a source region, and a drain region, the diode is formed by the source region and a doped region, and the metal silicide layer is opened with a clearance for at least exposing a junction between the source region and the doped region, and the method comprising:
applying a first voltage to the gate, applying a second voltage to the drain region, and applying a third voltage to the doped region, wherein the first voltage is sufficient for turning on a channel of the transistor, the second voltage provides a sufficient reverse bias to the junction between the source region and the doped region to cause a high reverse current flow through and bridge the diode.

18. The programming method of an OTPROM according to claim 17, wherein the first voltage is 2V to 15V, and various with respect to applied process.

19. The programming method of an OTPROM according to claim 17, wherein the second voltage is 1V to 10V.

20. The programming method of an OTPROM according to claim 17, wherein the third voltage is 0 V.

21. The programming method of an OTPROM according to claim 17, further comprising applying a fourth voltage to the substrate.

22. The programming method of an OTPROM according to claim 21, wherein the fourth voltage is 0 V.

* * * * *